US006404348B1

(12) United States Patent
Wilfong

(10) Patent No.: US 6,404,348 B1
(45) Date of Patent: Jun. 11, 2002

(54) MODULAR POWER QUALITY MONITORING DEVICE

(75) Inventor: Dennis Scott Wilfong, Brooksville, FL (US)

(73) Assignee: Power Quality Consultants, Inc., Brooksville, FL (US)

( * ) Notice: Subject to any disclaimer, the term of this patent is extended or adjusted under 35 U.S.C. 154(b) by 0 days.

(21) Appl. No.: 09/274,700

(22) Filed: Mar. 23, 1999

(30) Foreign Application Priority Data

Feb. 11, 1999 (WO) ................................. PCT/US99/03042

(51) Int. Cl.[7] .............................................. G08B 21/00
(52) U.S. Cl. .................................. 340/657; 340/310.08
(58) Field of Search ................................. 340/657, 660, 340/664, 310.01, 310.08

(56) References Cited

U.S. PATENT DOCUMENTS

| | | | |
|---|---|---|---|
| 3,368,146 A | 2/1968 | Regan et al. | |
| 3,593,124 A | 7/1971 | Cahen et al. | |
| 3,710,239 A | 1/1973 | Nakamura | |
| 3,778,801 A | 12/1973 | Nudelmont | |
| 4,075,675 A | 2/1978 | Burkett et al. | |
| 4,292,585 A | 9/1981 | Charette | |
| 4,362,986 A | 12/1982 | Burke et al. | |
| 4,609,914 A | * 9/1986 | Fathi ........................... | 340/660 |
| 4,644,320 A | * 2/1987 | Carr et al. .............. | 340/310.06 |
| 4,897,607 A | 1/1990 | Grunewald et al. | |
| 5,160,926 A | 11/1992 | Schweitzer, III | |
| 5,434,509 A | * 7/1995 | Blades ........................ | 324/536 |
| 5,477,133 A | 12/1995 | Earle | |
| 5,525,908 A | 6/1996 | Brownell | |
| 5,550,476 A | 8/1996 | Lau et al. | |
| 5,565,783 A | 10/1996 | Lau et al. | |
| 5,572,143 A | 11/1996 | Myers et al. | |
| 5,579,221 A | * 11/1996 | Mun ........................... | 364/188 |
| 5,664,202 A | * 9/1997 | Chen et al. .................. | 713/340 |
| 5,737,529 A | 4/1998 | Dolin, Jr. et al. | |

* cited by examiner

*Primary Examiner*—Edward Lefkowitz
(74) *Attorney, Agent, or Firm*—Larson & Larson, P.A.; James E. Larson

(57) ABSTRACT

A modular power quality monitoring device, adaptable to an electrical anomaly detection circuit, such as a surge protection device, comprises an electrical connection to an AC power line, voltage surge detection circuitry, a neuron microprocessor, a DC power source and a transmission circuit. The modular device is capable of detecting a plurality of electrical anomalies, such as voltage levels, current draw, power surges, phase outages, phase shifting, power factor, harmonic distortion and panel load. A plurality of the modular devices can be employed about a facility to create a power quality control network. A user interface permits data stored by the modular device to be retrieved and viewed on the display. Various ways of transmission can be employed, such as modulated power line transmission or free topology—twisted pair, RS485, fiber optics, RF carrier or computer modem connection.

38 Claims, 10 Drawing Sheets

MODULAR POWER QUALITY MONITORING DEVICE

PRIOR APPLICATIONS

This application is a §371 U.S. National Phase application which bases priority on International Application No. PCT/US99/03042, filed Feb. 11, 1999.

BACKGROUND OF THE INVENTION

1. Field of the Invention

This invention relates to a power quality monitoring, detecting and analyzation device. More particularly, it relates to a modular device adaptable to an electrical circuit, utilizing power quality equipment, which permits event counts of various changing electrical phenomenon to be stored in memory and broadcast over a control network.

2. Description of Prior Art

The issue of power quality has always been a concern for people utilizing electronic devices and machinery. Recently, for system engineers of facilities of all sizes, power quality has become their greatest concern. Advances in microelectronics has caused the advent of microprocessor-based equipment to be standard in almost all electronic devices, especially those found in large scale manufacturing and fabrication environments. Although microprocessor devices have resulted in "smarter" and more efficient electronic systems and devices, facility and system engineers are quickly discovering that transient voltages and power variations, which previously went unnoticed and were generally of no concern, are now compromising the reliability of the new microprocessor-based devices. One reason microprocessors are so sensitive is that most integrated circuits of today are far more dense and operate at higher speeds than those of even a few years ago and therefore more susceptible to the slightest of electrical anomalies. Where slower speed processors simply ignored the transients, high-speed processors interpret the transient as a command sequence directed at the processor.

Several factors contribute to voltage transients and power variations which degrade the overall power quality of a facility or system. These factors include: installation of highly sensitive electronic equipment and systems in antiquated facilities, use of a new facility that has not been designed with proper power quality in mind, improper or nonexistent power protection plans and improper design and installation of electrical distribution and grounding systems. All of these factors can contribute to poor power quality from resulting transient voltage surges, voltage sags and swells, phase outages, power factor irregularities, increased harmonic distortion and undesired current draw.

The anomalies that contribute to power quality degradation can be initiated by either external or internal causes. External causes such as lightning strikes and utility company faults can be devastating to a facility. But, it has been suggested that only about 20–35% of the power anomalies occur outside the facility, where as much as 65–80% of all power problems can be directly attributed to the local environment. Examples of internal or local environment causes include the use of elevators, air conditioners, vending machines, copiers and large computers. Even the simple task of turning lights on and off can cause rushes of power and transient voltages to travel on the power transmission lines, potentially damaging the circuitry of electronic equipment coupled thereto. For these reasons, systems and devices that suppress, filter and/or eliminate all types of undesired electrical anomalies have become quite common in all types of facilities, businesses and even homes.

There are many types of circuits and equipment that are potentially useful in eliminating undesired electrical anomalies. These power quality equipment (PQE) items include: isolation transformers, uninterruptible power supplies (UPS), voltage regulators, line or power conditioners, designated power distribution chassis, and transient voltage surge suppressors (TVSS), also known as surge protective devices (SPD). Although all of the aforementioned devices have special uses which may dictate their employment in a particular environment, SPD devices are the most widely used and accepted devices for dealing with voltage transients.

Transients are over-voltages or over-currents, typically lasting microseconds, that are caused by external and internal events. Transient voltage surges comprise the most severe and immediate danger to sensitive microprocessor controlled electrical and electronic equipment. For this reason, SPD devices are needed in sensitive electronic facility environments. Without SPD devices, manufacturing facilities utilizing sensitive electrical equipment, for instance robotic assembly, could be devastated if merely one robotic assembler was removed from the assembly line. The costs associated with a shutdown for repairs, replacement and reprogramming of a robotic machine could mean the difference between a profitable and non-profitable year for a company.

Most SPD devices comprise a stand alone unit which are coupled between the power source of a facility and a piece of electronic equipment. Many SPD devices use a combination of MOVs (metal oxide varistors) for high-energy surges and capacitors for low to medium surges and are activated by rise in the line voltage.

Although systems connected to an SPD or other PQE device are said to be adequately protected from transient voltage surges and other power quality anomalies, respectively, deficiencies exist which necessitate improvement thereupon. Specifically, nowhere in the prior art is there a device for monitoring and transmitting electrical phenomenon data adaptable to a SPD/PQE control network. A device is needed which can monitor and/or count the following: SPD/PQE status, voltage levels, current draw, power surges, phase outages, phase shifting, power factor, harmonic distortion and panel load. Such a device needs to be adaptable to a SPD or PQE control network.

SUMMARY OF THE INVENTION

The present invention addresses and overcomes the deficiencies in the prior art relating to the monitoring of electrical phenomenon in a control network utilizing TVSS devices. A control network comprises a group of nodes (each having one or more sensors or actuators, plus localized computational capability) which communicate over a type of media using a standard protocol to implement a sense, monitoring or sense and control application. The control network could have two to 20,000 (or more) nodes and can implement simple systems such as a few light switches or highly complex systems such as large robotic assembly lines.

Communication among the nodes may be peer-to-peer (distributed control) or master-slave (centralized control).

One existing protocol for a control network is the LONWORKS protocol developed by Echelon. In a LONWORKS network, a peer-to-peer or master-slave architecture can be used. If a peer-to-peer architecture is employed, no central control is needed. A control network utilizing the LON-WORKS protocol can perform a complex control application, such as running a robotic assembly line or automating an entire office building. Yet, each node in the LONWORKS network is capable of performing simple tasks, such as running sensors or motion detectors or actuating switches, relays or motor drives.

The present invention comprises a modular device connectable to a SPD, other PQE device or power panel. The modular device is in turn is coupled to a power source for establishing a power quality control network. In the preferred embodiment, the control network utilizes the LONWORKS protocol.

The modular device couples to a circuit for transient voltage surge suppression. The modular device comprises, a microprocessor neuron chip, surge detection circuitry, isolation circuitry for the transient voltage surge suppression circuitry, a pair of user interface push buttons, a transceiver communication circuit, a power supply, isolation circuitry for the power supply, an LED phase loss indicator, an audible alarm, dry relay contacts, an LCD display, electrical anomaly counting means and drivers for the audible alarm, dry relay contacts, LCD display and LED phase loss indicator. The device further comprises EPROM and programmable array logic coupled to the neuron chip.

The modular device is capable of determining various electrical phenomenon occurring in the electrical line to which the device is coupled, counting the number occurrences of such phenomenon, and transmitting that information to a central location for analysis by a system engineer or administrator of the facility. The central location could be a location within the facility and/or an off-site monitoring station. The detectable electrical phenomenon includes SPD/PQE status, voltage levels, current draw, power surges, phase outages, phase shifting, power factor, harmonic distortion and panel load. Voltage and current detection values may be set to specific levels of monitoring based on user specifications or standards tolerances, for example, voltage and current tolerances defined in Mil Spec 1399.

Different means of communication can be chosen by removing and replacing a separate modular printed circuit board connectable to the modular device. For example, the device can utilize the AC power line as a means for communication by connecting a power line transceiver board. Alternate means of communication include a free topology—twisted pair connection or RS485, fiber optic, RF carrier and modem communication.

THE LCD display operates in two primary display modes showing surge and phase outage data. The two modes can be toggled therebetween through the use of one of the user interface buttons or by means of transmitted computer command. Various sub-menus are accessible through the actuation of the user interface buttons and include System Control, a Test Mode, a Network Test Mode and Network Setup. The functions carried out in the sub-menus permit a user of the power quality modular device to set-up each device to particular parameters. Such parameters will be discussed in the Detailed Description of the Preferred Embodiment.

BRIEF DESCRIPTION OF THE DRAWINGS

The invention may be best understood by those having ordinary skill in the art by reference to the following detailed description when considered in conjunction with the accompanying drawings in which.

DETAILED DESCRIPTION OF THE INVENTION

Figure 1:
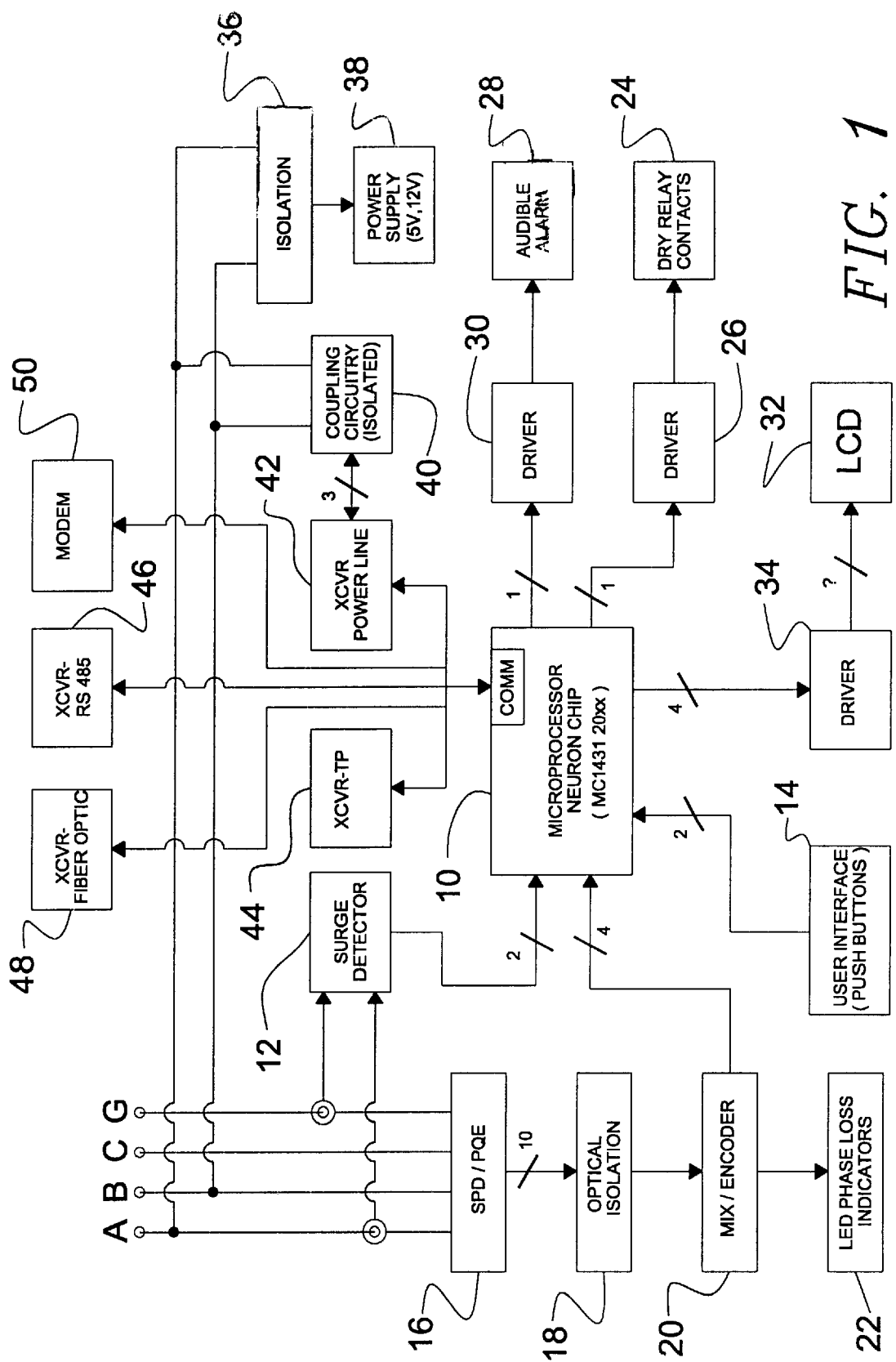
FIG. 1 is a block diagram of the circuitry used in the monitoring device of the present invention.

Throughout the following detailed description, the same reference numerals refer to the same elements in all figures.

Referring to FIG. 1, a block diagram is shown representing the primary components of a power quality detection modular device of the present invention. Each block represents either a single or set of electrical components coupled to the overall circuitry of a single modular device for detecting various electrical phenomenon inherent in three phase AC power lines. It is understood that a plurality of these modular devices can be employed throughout a given facility for establishing a power quality control network, wherein each modular device represents a single node on the network.

With continuing reference to FIG. 1, a neuron chip 10 is provided. Neuron chip 10 is a single IC package comprising three 8-bit in-line processors (two used for executing the protocol of the chip, the third used for the node's application). In the preferred embodiment a Motorola MC143150BlFU1 20 mHz IC is employed. Coupled to neuron chip 10 are EPROM and PAL ICs (not shown). Further coupled to neuron chip 10 is surge detection circuitry 12 comprising a low voltage indicator and voltage comparator. Surge detection circuitry 12 is coupled at a first side to one, two or three phases of the one, two or three phase AC power line, respectively, and at a second side to ground. The preferred embodiment couples to a three phase AC power line. A pair of push buttons form the user interface 14 which act upon neuron chip 10 when actuated by a user of the device. In the preferred embodiment, a function and an enter key are employed for the pair of push buttons.

With continuing reference to FIG. 1, the circuitry of the modular device employs a suitable means of electrical connection for coupling to the circuitry of a surge protection device (SPD), designated by the numeral 16 (in the preferred embodiment, a plug is employed as the suitable means of connection). It is understood that "power quality equipment" (PQE) could be interchanged with the term surge protection device. For example, a PQE device may include other circuitry in addition to surge protection circuitry for eliminating or monitoring other electrical anomalies. Optical isolation 18 is coupled between the TVSS circuitry 16 and the circuitry of the modular device for isolating TVSS circuitry 16 from the neuron chip circuitry. Optical isolation 18 is coupled to mix/encoder circuitry 20 and acts as an LED phase loss indicator driver. In the preferred embodiment, a set of three LEDs (one LED per phase) are employed for LED phase loss indication 22 for determining immediate independent visual indication of the three AC phases. If a true single phase system is employed, then one LED is used for the single phase. If a split phase system is employed, then two LEDs are used for the two phases. LED illumination confirms normal phase operation whereas loss of LED illumination indicates a loss of the associated phase. A set of dry relay contacts 24 are provided for employing alternate indication and alarm functions for the modular device. For example, if the modular device is employed within the housing of a SPD or other PQE device, the set of dry relay contacts 24 can be coupled to the circuitry of the SPD or other PQE device to drive various alarm and indication elements of such device. It is understood that the modular device of the present invention can be coupled to a SPD or other PQE device by either employing the modular device within the housing of such SPD or PQE device or attaching it alongside in its own box. In the preferred embodiment, the modular device is enclosed within its own housing and electrically coupled alongside the SPD or PQE device. In either embodiment, the circuitry of the modular device may be encapsulated in a compound for the purpose of environmental protection. Examples of compounds include epoxy resin and silicon.

With continuing reference to FIG. 1, a first driver 26 couples between neuron chip 10 and the set of dry relay contacts 24 for actuating the set of dry relay contacts 24 upon the happening of an event. An audible alarm 28 is provided for signaling a power line event. A second driver 30 couples between neuron chip 10 and alarm 28 for actuating alarm 28. In the preferred embodiment, drivers 26 and 30 are NPN transistors. An LCD display 32 is provided as a visual operator interface. LCD display 32 can be used to display numeric event counts and various alphanumeric messages, such as "Phase Out." Other alphanumeric messages can be seen by referencing FIGS. 2–18.

A third driver 34 is coupled between neuron chip 10 and LCD display 32 for displaying the numeric and alphanumeric data. In the preferred embodiment, third driver 34 is an octal latch IC. In the preferred embodiment, the circuitry of the modular device obtains its power from the AC power line. Isolation circuitry 36 is provided for isolating primary and secondary AC for use in a DC power supply 38. Isolation 36 comprises a power supply transformer. The transformer of isolation 36 can be configured to use one of multiple primary taps for varying voltage standards around the world. Accordingly, it can be configured for any and all voltages between 120 v and 600 v. Regulated 5 and 12 volt DC is outputted from DC power supply 38 through the use of a pair of independent voltage regulators.

Neuron chip 10 can communicate its node data to a central location through the use of various communication protocols, including, for example, AC power-line transmission, free topology—twisted pair, RS485 communication, fiber optics, RF carrier or a computer modem connection. If communication is to be carried through AC power-line transmission, isolated coupling circuitry 40 is employed, coupled to two of the three AC phases, for isolating the AC power-line from the data transmission/receiver circuitry. As shown in FIG. 1, separate circuitry for each type of means of communication can be coupled to a communication port of neuron chip 10 through the circuitry of the modular device.

In the preferred embodiment, AC power-line transmission is used as the means for communication. Such preferred means employs a separate connectable circuit board 42 for coupling to the communication port of neuron chip 10. The power-line transmission board 42 comprises a power-line transceiver, first and second LEDs, a power-line coupling circuit and a 2×10 header for connection to a plug on the modular device circuit board. In the preferred embodiment, the power-line transceiver is an Echelon PLT-21 which can send a 5 kbps burst along the 60 Hz power-line. The first and second LEDs are used to indicate "band-in-use" and "packet-detect" respectively. The power-line coupling circuit comprises a transformer, such as an Exel 1:1 isolation transformer, a plurality of resistors, a plurality of capacitors and a diode acting as a fast recovery rectifier. At least one of the capacitors of the power-line coupling circuitry is interchangeable depending on the primary tap of the transformer used in the isolation circuitry 36.

Alternate means of communication include free topology—twisted pair communication 44, RS485 communication 46, fiber optics 48, RF carrier (not shown) and a computer modem connection 50. Each of five alternate means of communication also comprise a separate printed circuit board which can be coupled to the communication port of neuron chip 10 through the circuitry of the modular device. It is understood that the modular device could be constructed such that all six types of communication means (one preferred and five alternates) are coupled to the circuitry of the modular device; the user of the device would then chose the appropriate means for communication. But, in the preferred embodiment, only one type of communication means is coupled to the modular device at any given time, each communication means removably connected to the modular device circuit board. In either configuration, the EPROM chip can be pre-programmed to include all modes of communication wherein a user merely selects the desired mode through a computer interface.

The circuitry of the first alternate means of communication employs free topology, twisted pair communication. This circuitry employs an Echelon FTT-10A transceiver, a plurality of data line and power supply protection diodes, a plurality of DC filter, RF and power supply bypass capacitors, a buffer resistor, a terminal block for connection to the twisted pair cabling with spark gap pads and a 2×10 header for connection to the plug of the modular device circuit board.

The circuitry of the second alternate means of communication employs RS485 communication. This circuitry employs a Maxim 481 differential line driver/receiver transceiver, a plurality of data line protection diodes, a plurality of power supply zener diodes for regulating 12 v DC, a buffer resistor, a 1×3 terminal block with spark gap pads and a 2×10 header for connection to the plug of the modular device circuit board.

In the preferred embodiment, the modular power quality monitoring device detects surges and phase outages of the circuit to which it is coupled, although other electrical phenomenon can be detected and are listed hereinabove. When surge detection circuitry 12 of the present invention detects a surge on either the phase or ground line, the modular power quality monitoring device displays this as a count on LCD 32. If there is a phase outage detected by SPD/PQE circuitry 16, LCD 32 displays the alphanumeric message "Phase Out." The power quality modular device of the present invention considers a phase outage as an event. Whenever an event occurs, the set of dry relay contacts 24 change state, LEDs 22 blink and alarm 28 sounds. If the power quality modular device is utilizing the LONWORKS interface, these events are broadcast over the interface. Such event happenings can then be reviewed via the user interface 14 so that the system can be tuned to the liking of the user. In an alternate embodiment, if a phase outage occurs and is detected and/or counted by the modular power quality monitoring device, the circuit to which it is coupled may be opened thereby disconnecting the power source from the piece of electronic equipment being monitored.

Referring to FIGS. 2–18, a plurality of flow diagrams are shown representing the various menus and modes accessible through actuation of the two user interface buttons, the Function and Enter Keys respectively, and the resulting numeric or alphanumeric display of LCD 32. LCD 32 and the Function and Enter Keys are all accessible from a front panel (not shown) of the power quality modular device. In all the flow diagrams contained herein, LCD 32 is represented by a rounded edge rectangular-shaped box while the Function and Enter Keys are represented by diamond-shaped boxes.

Figure 2:
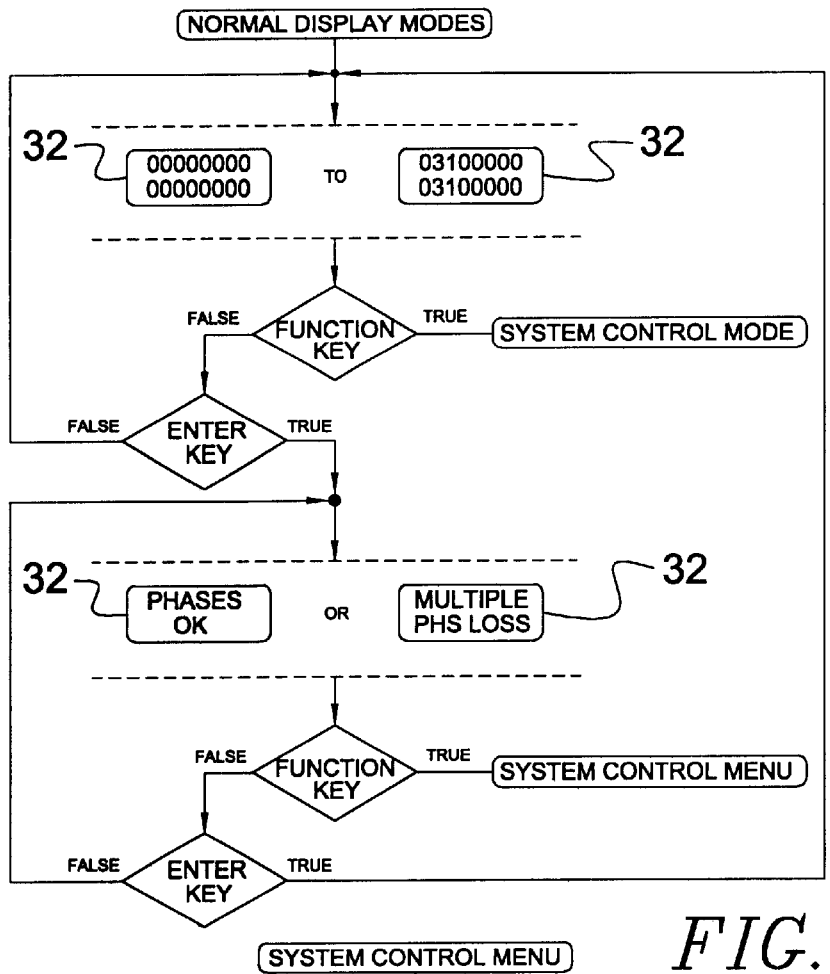
FIG. 2 is a flow diagram of the Normal Display Mode of the monitoring device.

With reference first to FIG. 2, the Normal Display Mode is depicted. LCD 32 is represented twice on FIG. 2 to give an example of the numeric counting scheme of electrical events such as surges or phase outages. LCD 32 displays two rows of numbers, representing normal surge count (power-line anomalies: line to line and line to neutral) and common surge counts (ground anomalies: line to ground and neutral to ground). From the Normal Display Mode, a user can actuate the Function Key and move to the System Control Menu. Or, if the user wishes to know the status of the phase of the AC power-line which is associated with this particular power quality modular device, the Enter Key is instead actuated whereby LCD 32 will display "Phases OK" or "Multiple Phase Loss." From this point, the user can actuate the Function Key, taking the user into the System Control Menu, actuate the Enter Key a second time, taking the user back to the event count display of the Normal Display Mode, or do nothing, leaving the "Phase" data displayed on LCD 32. In an alternate embodiment, the modular device can be programmed to display customer proprietary or encrypted display data.

Figure 3:
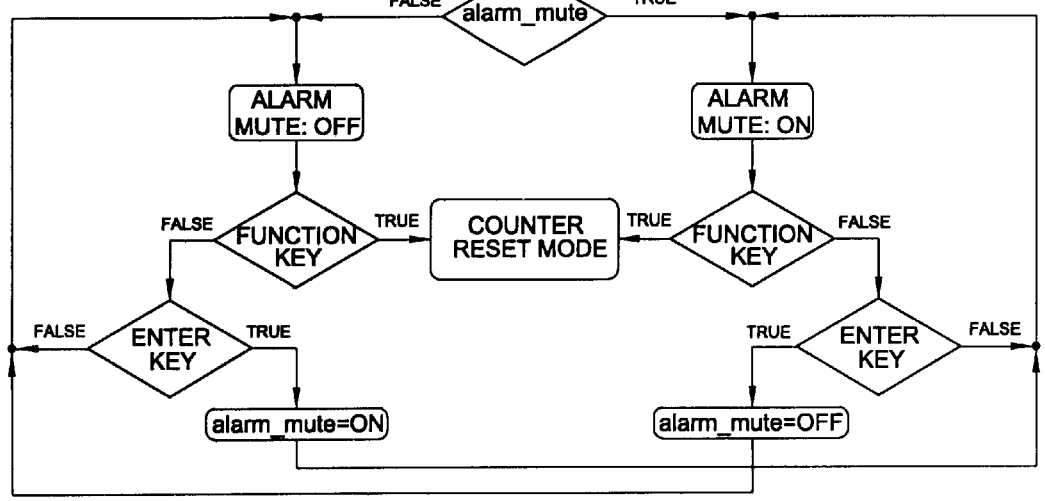
FIG. 3 is a flow diagram of the Mute Mode within the System Control Menu of the monitoring device.

With reference now to FIG. 3, the System Control Menu is depicted which permits the user to enter three sub-menus (or modes) for changing the state of the audible alarm mute, resetting the event counters and resetting the surge and SPD/PQE alarms. The first default mode entered from the beginning of the System Control Menu is the audible alarm Mute Mode. Depending on the current state of alarm 28 (such setting is displayed on LCD 32 when first entering mode), actuation of the Enter Key permits the alarm mute to be set "on" or "off," with the new setting being displayed on LCD 32. If the user desires to leave the state of the alarm mute unchanged, or after the user has set the alarm mute to the desired setting, actuation of the Function Key takes the user to the Counter Reset Mode.

Figure 4:
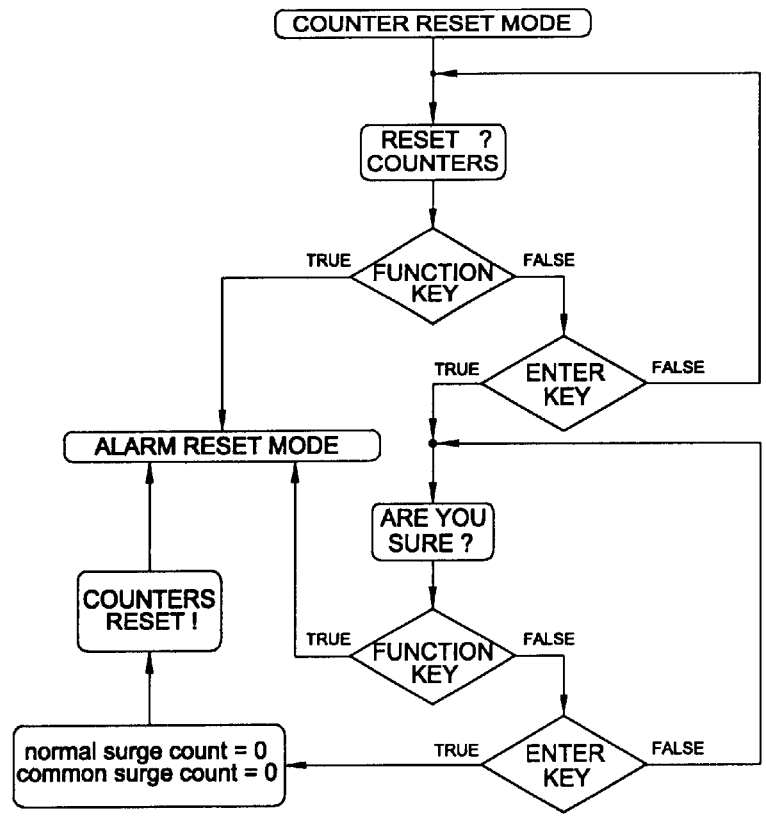
FIG. 4 is a flow diagram of the Counter Reset Mode within the System Control Menu of the monitoring device.

With reference now to FIG. 4, the Counter Reset Mode is depicted which permits the user to reset the normal and common surge counts. When first entering this mode, a query is displayed on LCD 32 asking whether the user wishes to "Reset Counters?" By actuating the Enter Key, the user is again asked whether this is the desired result by querying on LCD 32 "Are You Sure?" If yes, the user actuates the Enter Key which results in the clearing of both the normal and surge counts; LCD 32 will display "Counters Reset!" If the user wishes not to reset the counters, the Function Key can be actuated at either query point which results in the program moving to the Alarm Reset Mode. The Alarm Reset Mode is also reached after the counters are reset.

Figure 5:
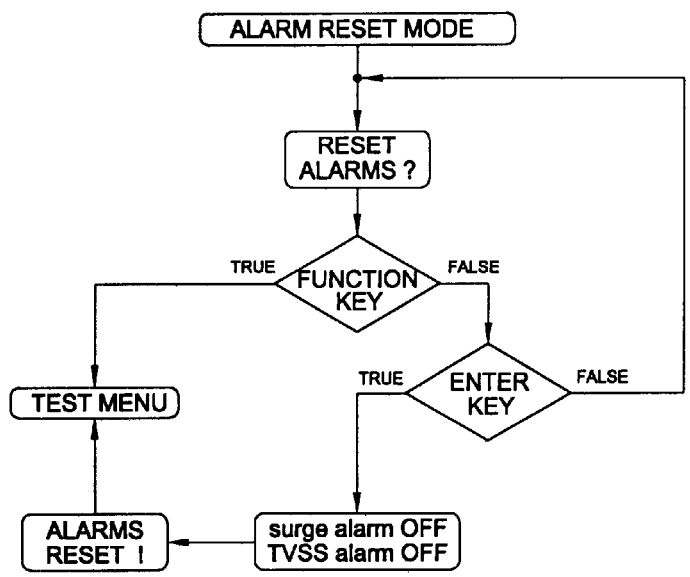
FIG. 5 is a flow diagram of the Alarm Reset Mode within the System Control Menu of the monitoring device.

Referring now to FIG. 5, the Alarm Reset Mode is depicted which permits the user to reset the surge and SPD alarms. In this embodiment, the set of dry relay contacts 24 are used and are electrically coupled to the alarm(s) of the SPD/PQE device used with the modular power quality monitoring device. When first entering the Alarm Reset Mode, the user is asked whether to "Reset Alarms?" If the user wishes to reset the alarm, the Enter Key is actuated causing both the surge and SPD alarm to be reset or set to off. Thereafter, a alphanumeric message of "Alarms Reset!" will be displayed on LCD 32. If the user did not wish to reset the alarms, actuating the Function Key would move the user out of the Alarm Reset Mode and into the Test Menu. Also, if the alarms are reset, the program would take the user into the Test Menu after such resetting.

Figure 6:
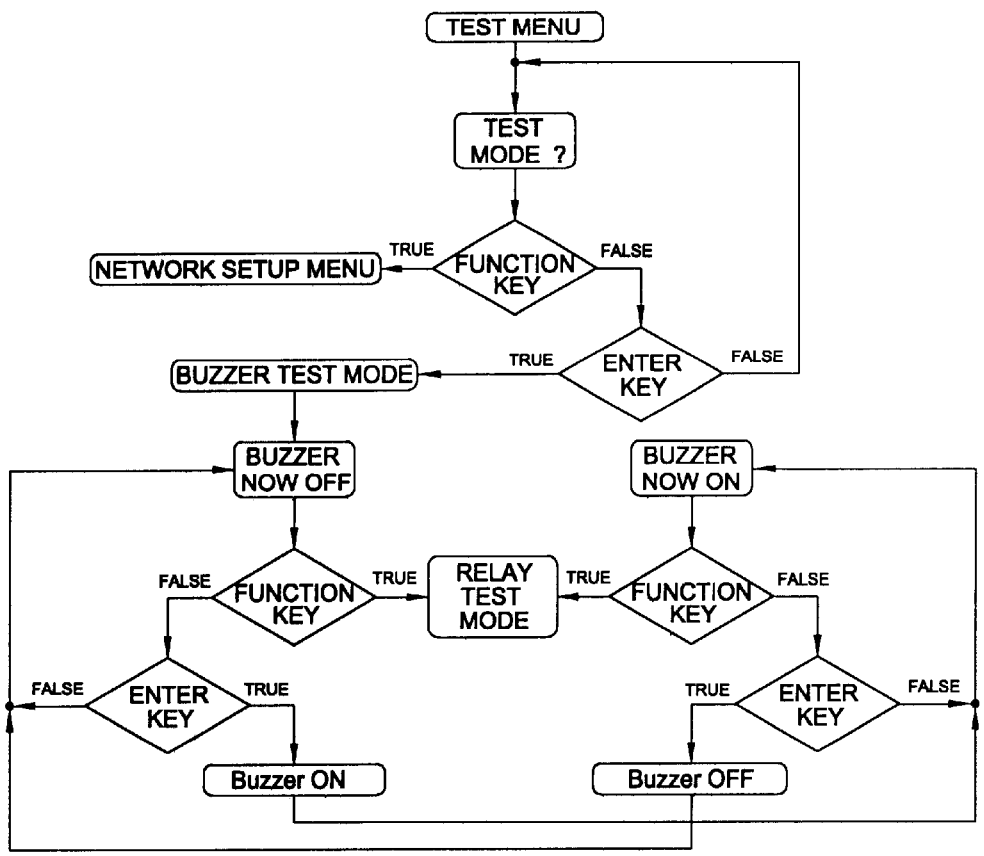
FIG. 6 is a flow diagram of the Buzzer Test Mode within the Test Menu of the monitoring device.

Referring now to FIG. 6, the Test Menu is depicted which permits the user to enter two sub-menus (or modes) for testing the buzzer and for testing the relays. When the Test Menu is first entered, a query is asked on LCD 32 whether the users wishes to enter the "Test Mode?" If no, the Function Key is actuated which takes the user to the Network Setup Menu. If yes, the Enter Key is actuated taking the user into the Buzzer Test Mode whereby the status of the buzzer is shown on LCD 32, such as "Buzzer Now On" or "Buzzer Now Off." Depending on the current state of the buzzer, the Enter Key is actuated to flip-flop the state of the buzzer from "off to on" or "on to off." If the user wishes to leave the state of the buzzer unchanged, the Function Key is actuated taking the user into the Relay Test Mode. If the user has changed the state of the buzzer, the new state will be displayed on LCD 32. Thereafter, the user can actuate the Function Key to move to the Relay Test Mode.

Figure 7:
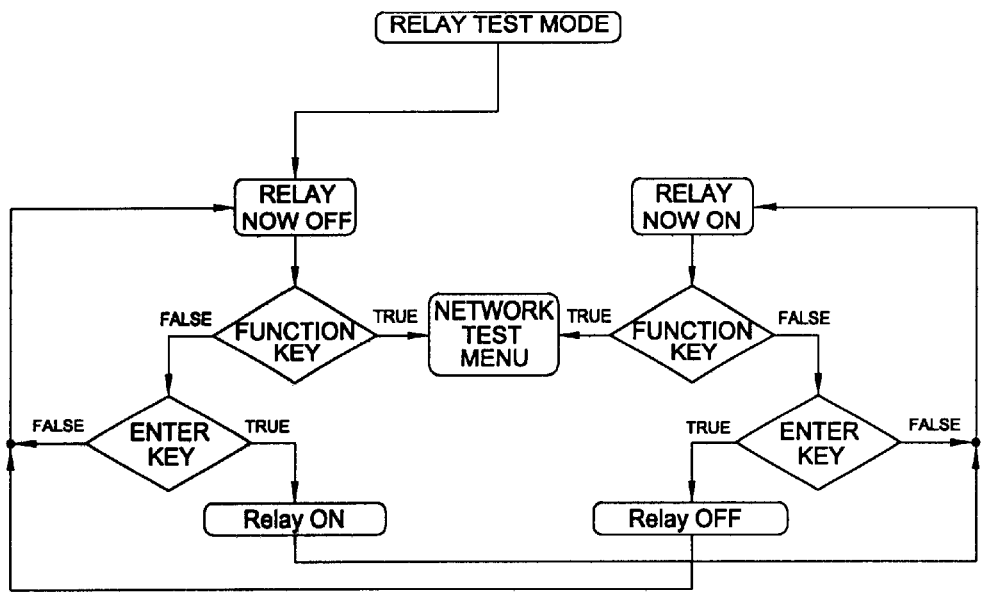
FIG. 7 is a flow diagram of the Relay Test Mode within the Test Menu of the monitoring device.

Referring to FIG. 7, the Relay Test Mode is depicted which permits the user to change the state of the relay. Depending on the current state of the relay the Enter Key is actuated to flip-flop the state of the relay buzzer from "off to on" or "on to off." If the user wishes to leave the state of the relay unchanged, the Function Key is actuated taking the user into the Network Test Menu. If the user has changed the state of the relay, the new state will be displayed on LCD 32. Thereafter, the user can actuate the Function Key to move to the Network Test Menu.

Figure 8:
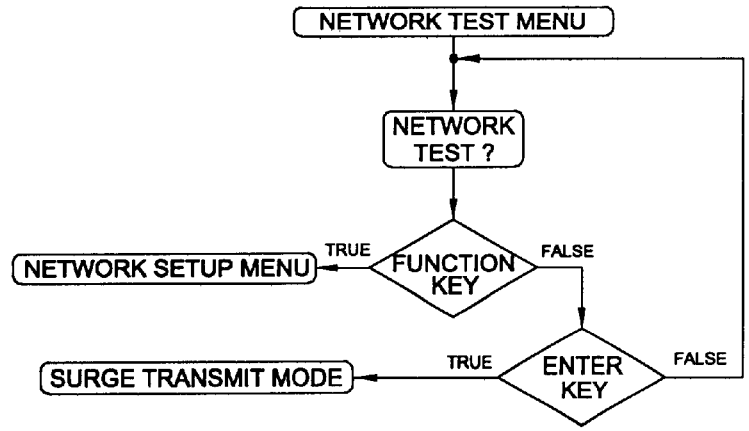
FIG. 8 is a flow diagram of the Network Test Menu of the monitoring device.

Referring to FIG. 8, the Network Test Menu is depicted permitting the user to enter three sub-menus (or modes) to transmit surge counts, transmit phase status and transmit the unique I.D. of device. When first entering the Network Test Menu, a query is first asked of "Network Test?" If the answer is no, the Function Key is actuated taking the user to the Network Setup Menu. If yes, the Enter Key is actuated, taking the user into the Surge Transmit Mode.

Figure 9:
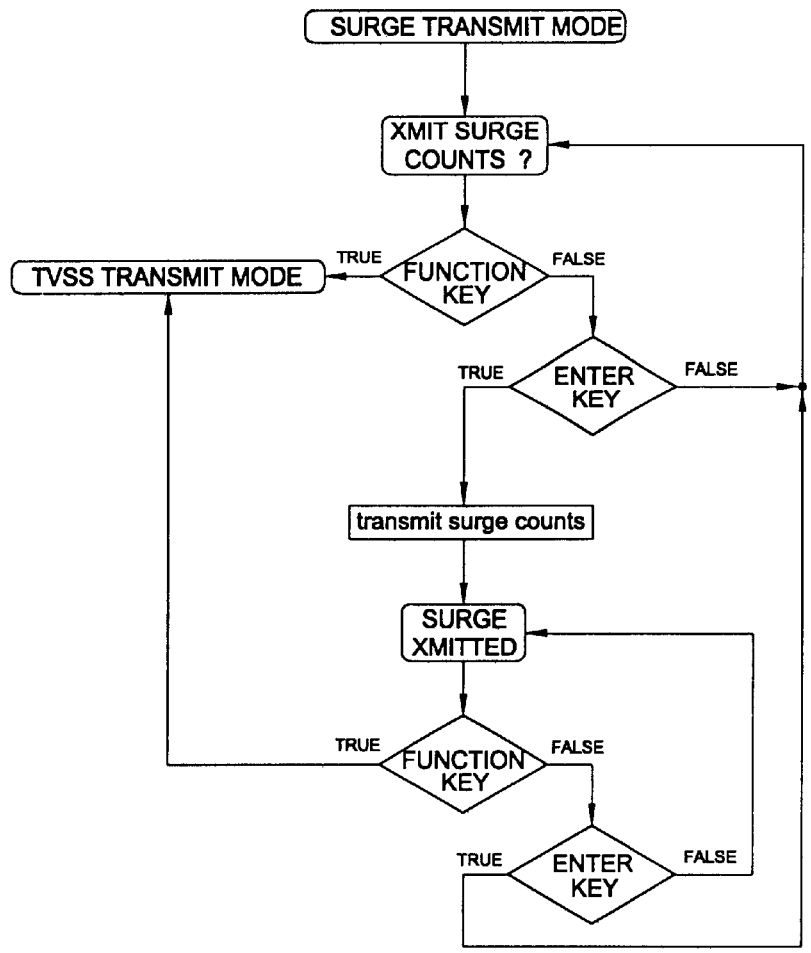
FIG. 9 is a flow diagram of the Surge Transmit Mode within the Network Test Menu of the monitoring device.

Referring now to FIG. 9, the Surge Transmit Mode is depicted. Upon first entering therein, a query is asked whether the user wishes to "Transmit Surge Counts." If no, the Function Key is actuated whereby the program moves to the TVSS Transmit Mode. If yes, the user actuates the Enter Key, whereby the surge counts are transmitted over the means for communication and LCD 32 displays "Surge Transmitted." Thereafter, if the Function Key is actuated, the program moves to the TVSS Transmit Mode. If the Enter Key is actuated after the surge counts have been transmitted, the program moves back to a point wherein the query is asked whether the user wishes to "Transmit Surge Counts?" At this point, the user can actuate the Function Key to move out of the Surge Transmit Mode and into the TVSS Transmit Mode.

Figure 10:
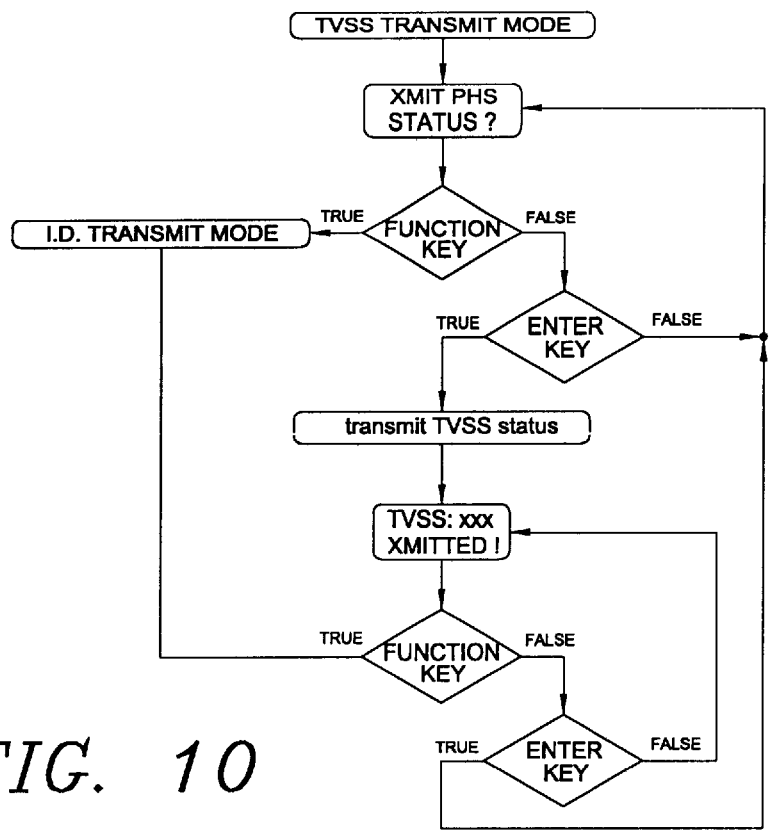
FIG. 10 is a flow diagram of the TVSS Transmit Mode within the Network Test Menu of the monitoring device.

Referring now to FIG. 10, the TVSS Transmit Mode is depicted. Upon first entering therein, a query is asked whether the user wishes to "Transmit Phase Status?" If no, the Function Key is actuated whereby the program moves to the I.D. Transmit Mode. If yes, the user actuates the Enter Key, whereby the TVSS phase status is transmitted over the means for communication and LCD 32 displays "TVSS xxx Transmitted," wherein "xxx" represents the status of each phase. Thereafter, if the Function Key is actuated, the program moves to the I.D. Transmit Mode. If the Enter Key is actuated after the TVSS phase status has been transmitted, the program moves back to a point wherein the query is asked whether the user wishes to "Transmit Phase Status?" At this point, the user can actuate the Function Key to move out of the TVSS Transmit Mode and into the I.D. Transmit Mode.

Figure 11:
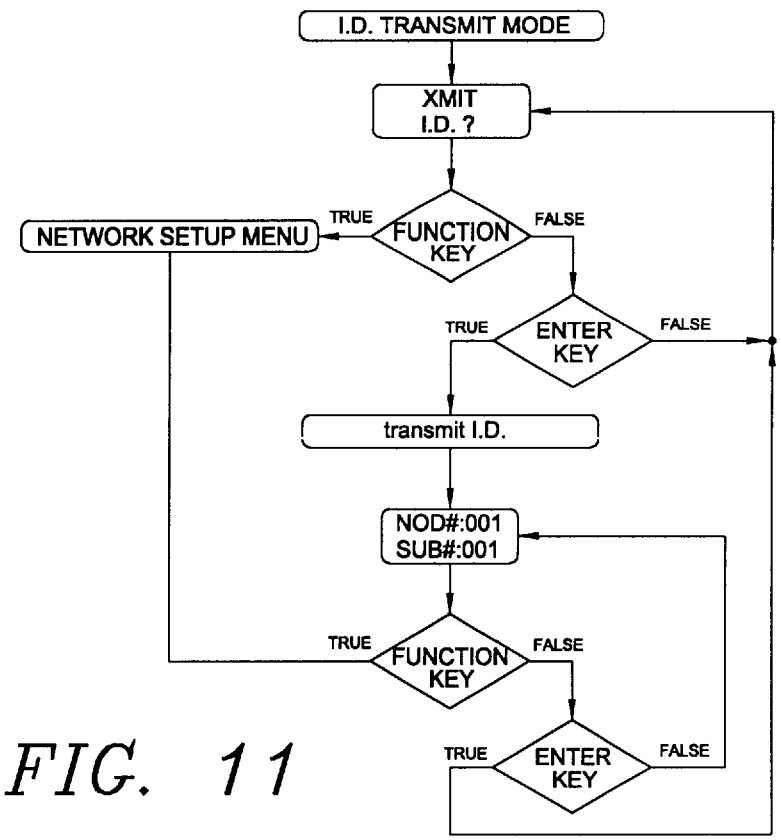
FIG. 11 is a flow diagram of the I.D. Transmit Mode of the Network Test Menu of the monitoring device.

Referring now to FIG. 11, the I.D. Transmit Mode is depicted. Upon first entering therein, a query is asked whether the user wishes to "Transmit I.D.?" If no, the Function Key is actuated whereby the program moves to the Network Setup Menu. If yes, the user actuates the Enter Key, whereby the I.D. is transmitted over the means for communication and LCD 32 displays a message such as "NOD#:001 SUB#001," wherein "NOD#" represents the node number of a particular modular power quality monitoring device with a sub net and "SUB#" represents the subnet number (in the preferred embodiment, there can be one thousand different subnets each having one thousand nodes associated therewith). Thereafter, if the Function Key is actuated, the program moves to the Network Setup Menu. If the Enter Key is actuated after the I.D. numbers have been transmitted, the program moves back to a point wherein the query is asked whether the user wishes to "Transmit I.D.?" At this point, the user can actuate the Function Key to move out of the I.D. Transmit Mode and into the Network Setup Menu.

Figure 12:
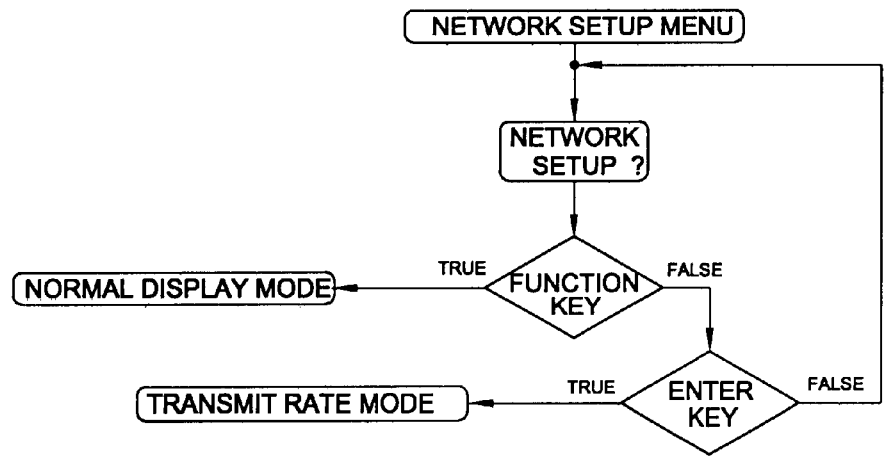
FIG. 12 is a flow diagram of the Network Setup Menu of the monitoring device.

Referring now to FIG. 12, the Network Setup Menu is depicted which permits the user to access six sub-menus (or modes) for setting a transmit rate, setting a transmit mode, toggling a polled transmit mode between on and off, toggling an on-activity transmit mode between on and off, toggling a periodic transmit mode between on and off and for transmitting a service pin number. Upon first entering the Network Setup Menu, a query is asked on LCD 32 whether the user wishes to implement a "Network Setup?" If no, the Function Key is actuated taking the use back into the Normal Display Mode of FIG. 2. If yes, the Enter Key s actuated taking the user into the Transmit Rate Mode.

Figure 13:
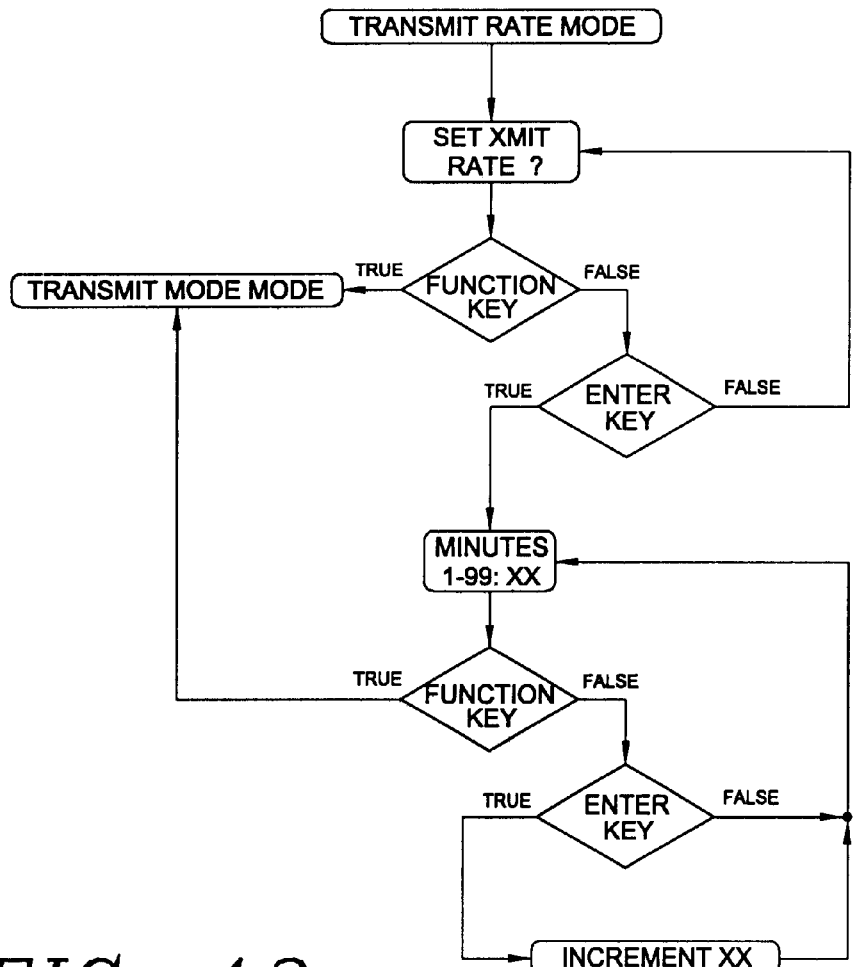
FIG. 13 is a flow diagram of the Transmit Rate Mode within the Network Setup Menu of the monitoring device.

Referring now to FIG. 13, the Transmit Rate Mode is depicted. Upon first entering this mode, a query is made via LCD 32 asking whether the user wishes to "Set Transmit Rate." If no, the Function Key is actuated taking the user into the Transmit Mode Mode. If yes, the Enter Key is actuated whereby the current transmit rate is shown on LCD 32, such as "Minutes –99: xxx" whereby xxx represents the value currently set. If the user does not wish to change the setting, the Function Key is actuated taking the user into the Transmit Mode Mode. If the user wishes to change the rate, the Enter Key is actuated repetitively until the desired rate in minutes is reached. Thereafter, the Function Key is actuated taking the user into the Transmit Mode Mode.

Figure 14:
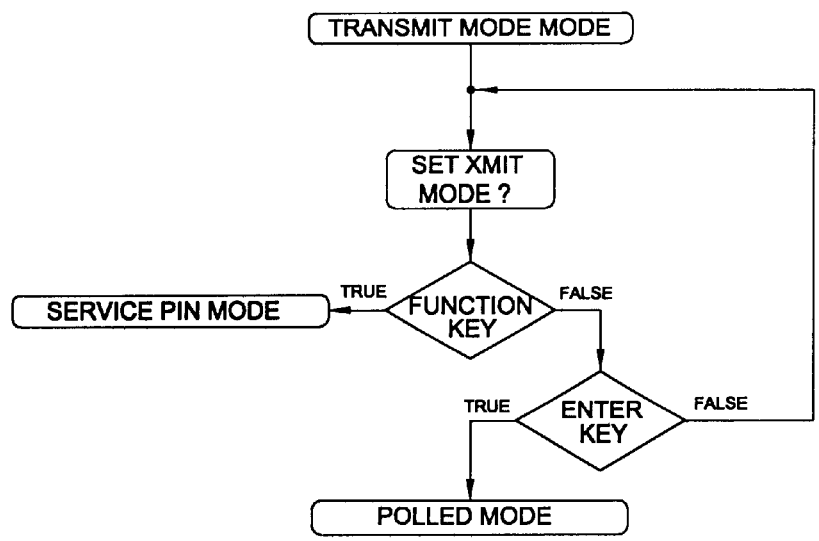
FIG. 14 is a flow diagram of the Transmit Mode Mode within the Network Setup Menu of the monitoring device.

Referring to FIG. 14, the Transmit Mode Mode is depicted. Upon first entering therein, a query is made on LCD 32 asking whether the user wishes to "Set Transmit Mode?" If no, the Function Key is actuated taking the user into the Service Pin Mode. If yes, the Enter Key is actuated taking the user into the Polled Mode.

Figure 15:
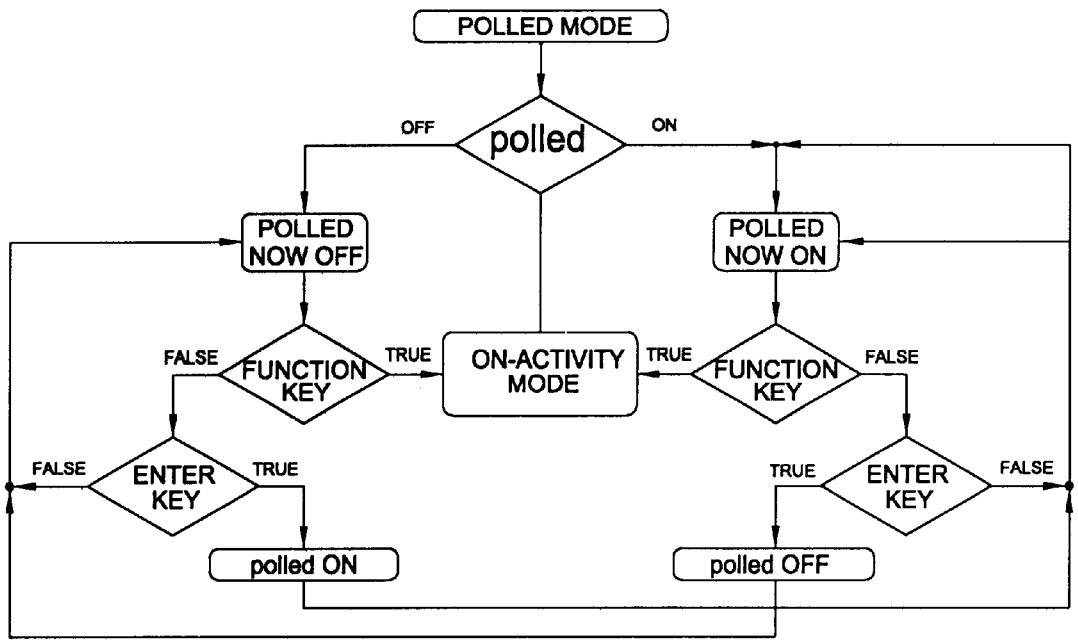
FIG. 15 is a flow diagram of the Polled Mode within the Network Setup Menu of the monitoring device.

Referring to FIG. 15, the Polled Mode is depicted. Depending on the current status of the Polled Mode, LCD 32 will display either "Polled Now Off" or "Polled Now On." If the user wishes to leave the Polled Mode unchanged, the Function Key is actuated taking the user into the On-Activity Mode. If the user wishes to change the state, the Enter Key is actuated causing the state to change from either "on to off" or "off to on." In either case, LCD 32 will display the new state as described directly above. Thereafter, actuation of the Function Key takes the user into the On-Activity Mode."

Figure 16:
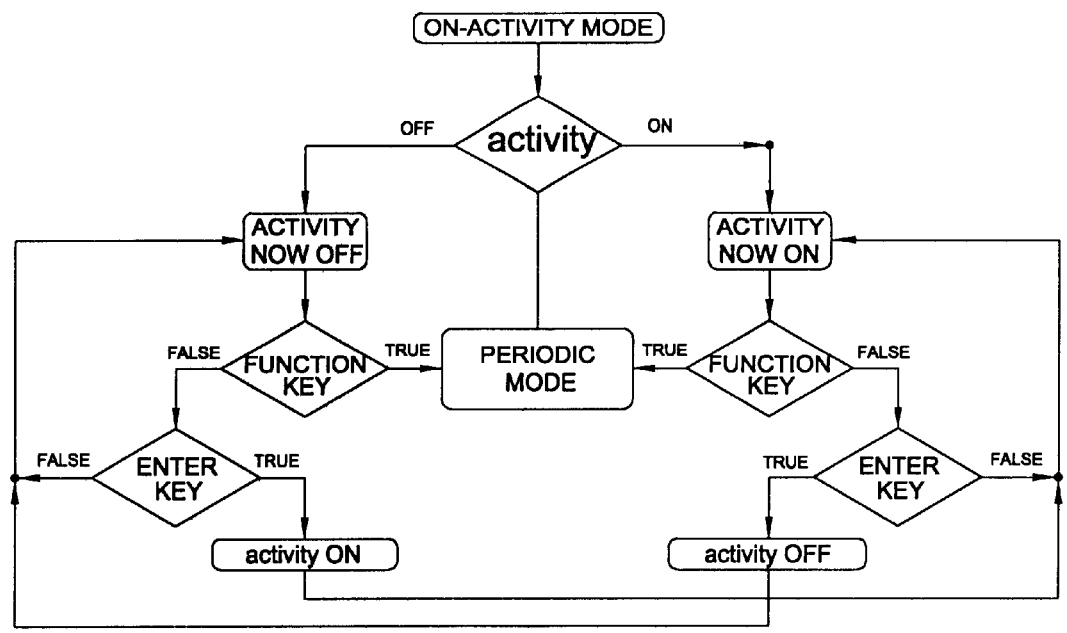
FIG. 16 is a flow diagram of the On-Activity Mode within the Network Setup Menu of the monitoring device.
Figure 17:
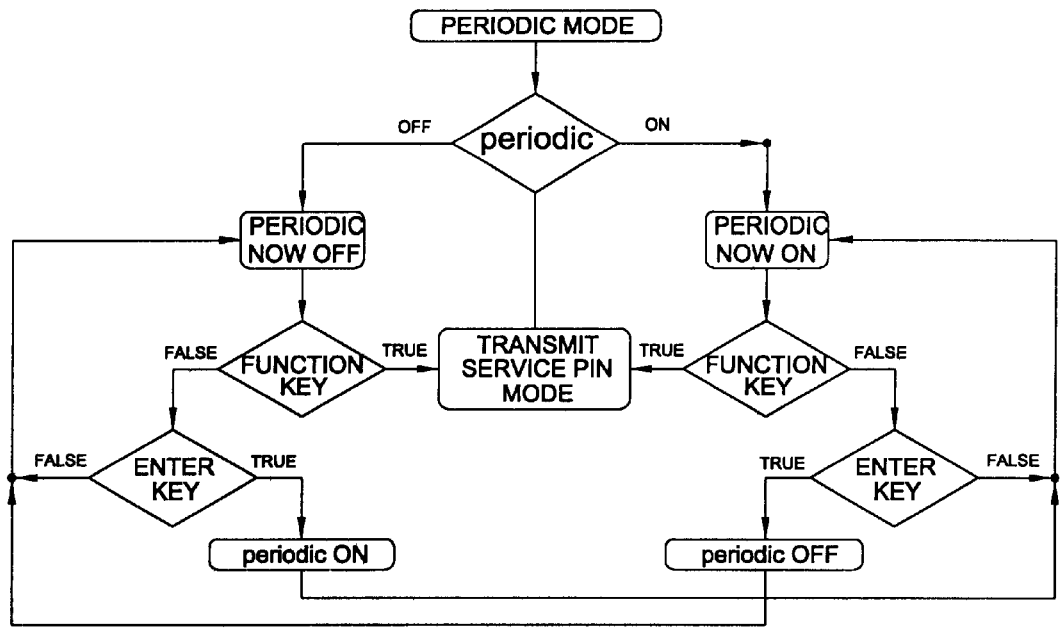
FIG. 17 is a flow diagram of the Periodic Mode within the Network Setup Menu of the monitoring device.

Referring to FIG. 16, the On-Activity Mode is depicted. Depending on the current status of the On-Activity Mode, LCD 32 will display either "Activity Now Off" or "Activity Now On." If the user wishes to leave the On-Activity Mode unchanged, the Function Key is actuated taking the user into the Periodic Mode. If the user wishes to change the state, the Enter Key is actuated causing the state to change from either "on to off" or "off to on." In either case, LCD 32 will display the new state as described directly above. Thereafter, actuation of the Function Key takes the user into the Periodic Mode." Referring to FIG. 17, the Periodic Mode is depicted. Depending on the current status of the Periodic Mode, LCD 32 will display either "Periodic Now Off" or "Periodic Now On." If the user wishes to leave the Periodic Mode unchanged, the Function Key is actuated taking the user into the Transmit Service Pin Mode. If the user wishes to change the state, the Enter Key is actuated causing the state to change from either "on to off" or "off to on." In either case, LCD 32 will display the new state as described directly above. Thereafter, actuation of the Function Key takes the user into the Transmit Service Pin Mode.

Figure 18:
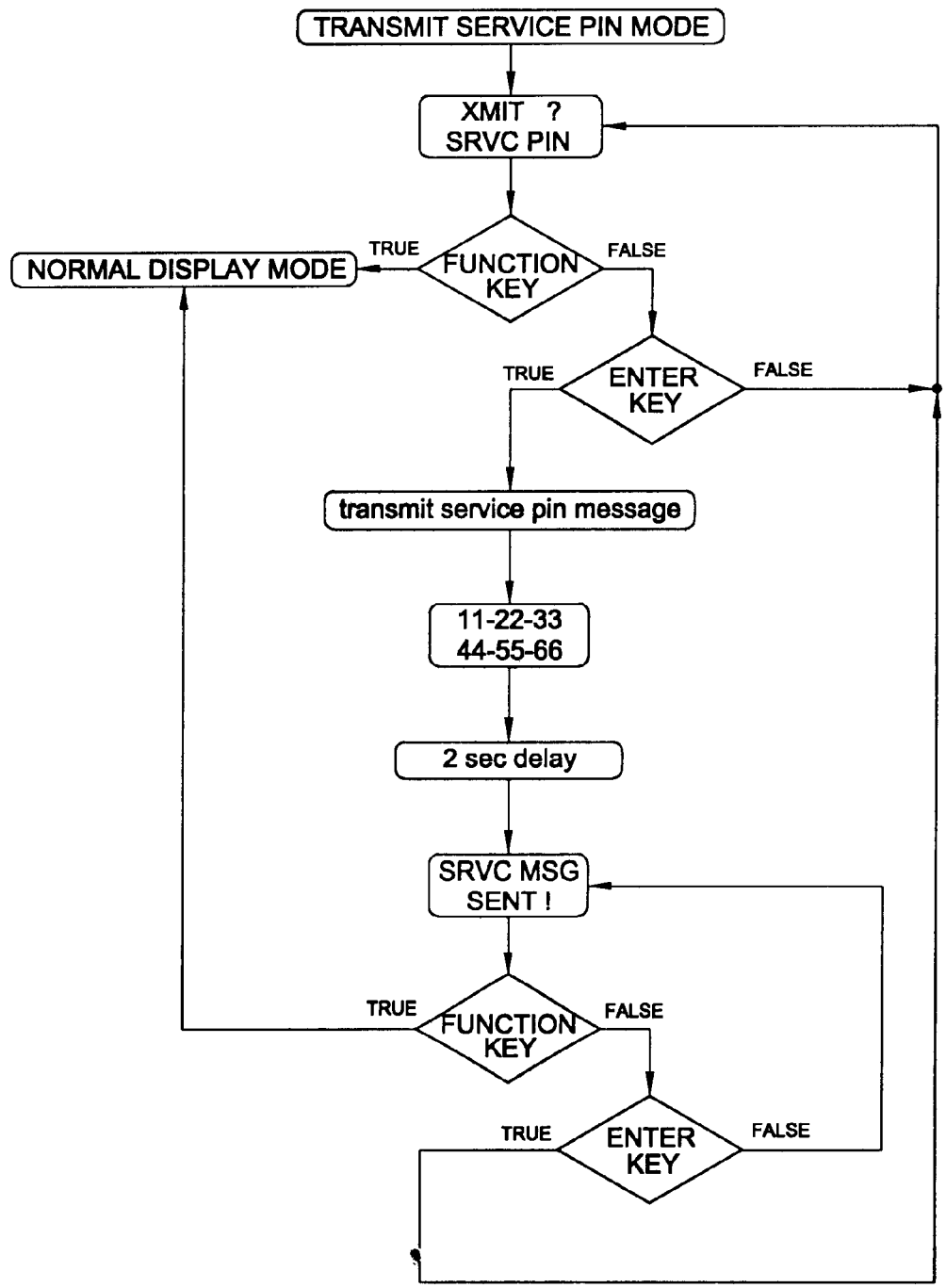
FIG. 18 is a flow diagram of the Transmit Service Pin Mode within the Network Setup Menu of the monitoring device.

Referring to FIG. 18, the Transmit Service Pin Mode is depicted. Upon first entering therein, a query is asked whether the user wishes to "Transmit the Service Pin." If no, the Function Key is actuated returning the user back to the Normal Display Mode of FIG. 2. If yes, the Enter Key is actuated, causing a service pin message to be transmitted over the means for communication. Each service pin is unique is represented by a series of numbers.. The number sequence would temporarily be displayed on LCD 32 for two seconds. The number would look like "11–22–33–44–55–66." and be displayed in a two row format (see FIG. 18). After the two seconds, a message is displayed on LCD 32 stating "Service Message Sent!" If the Function Key is actuated directly thereafter, the user would be taken back to the Normal Display Mode of FIG. 2. If the Enter Key is actuated, the user is taken back to the beginning of the Transmit Service Pin Mode sequence wherein it is asked whether the user wishes to "Transmit Service Pin." If the use has completed the set-up, the Function Key is actuated taking the use back to the Normal Display Mode of FIG. 2.

Equivalent elements and components can be substituted for the ones set forth above to achieve the same results in the same manner. And, equivalent steps can be employed for the ones set forth above to achieve the same results in the same manner.

I claim:

1. A power quality monitoring circuit adaptable to an electrical anomaly detection circuit for creating a single node on a control network, the power quality monitoring circuit capable of detecting and storing data relating to a plurality of electrical anomalies occurring on a power line circuit to which the electrical anomaly detection circuit is coupled, the power quality monitoring circuit further capable of transmitting the data to a central location, the power quality monitoring circuit comprising:
  a) an electrical connection to the power line circuit,
  b) voltage surge detection circuitry coupled to the electrical connection,
  c) a microprocessor electrically coupled to the voltage surge detection circuitry, the microprocessor having a unique identification number representing the node location of the power quality monitoring circuit on the control network,
  d) a regulated DC power supply,
  e) transmission means for transmitting the electrical anomaly data detected and stored by the power quality monitoring circuit over the control network to the central location, and
  f) display means for displaying numeric and alphanumeric data relating to electrical anomalies detected by the power quality monitoring circuit.

2. The power quality monitoring circuit of claim 1, wherein the power line circuit is an AC circuit chosen from the group consisting of a single, two and three phase AC circuit, the electrical connection to the AC power line circuit established by coupling the power quality monitoring circuit to the one, two or three phases, respectively, and ground of the AC circuit.

3. The power quality monitoring circuit of claim 2, further comprising phase loss indication means for indicating the loss of any of the phases of the AC power line circuit.

4. The power quality monitoring circuit of claim 3, wherein the phase loss indication means employs a single LED for each phase of the AC power line circuit.

5. The power quality monitoring circuit of claim 1, wherein the voltage surge detection circuitry comprises a low voltage indicator and a voltage comparator.

6. The power quality monitoring circuit of claim 1, wherein the microprocessor is a neuron chip comprising:
  a) memory,
  b) a transceiver port, and
  c) embedded firmware.

7. The power quality monitoring circuit of claim 6, wherein the transmission means is a transmission circuit capable of interfacing with a communication medium of the control network, the transmission circuit coupled to the neuron chip transceiver port.

8. The power quality monitoring circuit of claim 7, wherein the communication medium is chosen from the group comprising modulated power line transmission, free topology—twisted pair, RS-485, fiber optic, RF carrier and computer modem communication.

9. The power quality monitoring device of claim 1, wherein the display means comprises an LCD display and a driver circuit coupled to the microprocessor.

10. The power quality monitoring circuit of claim 1, further comprising:
  a) user interface means for permitting a user to extract electrical anomaly data stored by the power quality monitoring circuit and for setting network parameters associated with the node location of the power quality monitoring circuit on the control network, and
  b) alarm means for providing signals to a user that certain electrical anomalies have occurred on the power line.

11. The power quality monitoring circuit of claim 10, wherein the user interface means comprises a function and an enter push button, each push button electrically coupled to the microprocessor and capable of being actuated, permitting the user to access a series of menus for setting network parameters, displaying electrical anomaly data on the display means and initiating a data transmission along the control network through the transmission means.

12. The power quality monitoring circuit of claim 10, wherein the user interface means comprises a computer interface connection to the circuit, the computer interface connection permitting the user to access a series of menus for setting network parameters, displaying electrical anomaly data on the display means and initiating a data transmission along the control network through the transmission means.

13. The power quality monitoring circuit of claim 12, wherein the display means is a monitor connected to a computer.

14. The power quality monitoring circuit of claim 10, wherein the alarm means comprises a speaker and a driver circuit electrically coupled to the microprocessor.

15. A modular power quality monitoring device adaptable to an electrical anomaly detection circuit for creating a single node on a power quality control network, the modular power quality monitoring device capable of detecting and storing data relating to a plurality of electrical anomalies occurring on a power line circuit to which the electrical anomaly detection circuit is coupled, the modular power quality monitoring device further capable of transmitting the data to a central location, the modular power quality monitoring device comprising:
  a) an electrical connection to the power line circuit,
  b) voltage surge detection circuitry coupled to the electrical connection,
  c) a microprocessor electrically coupled to the voltage surge detection circuitry, the microprocessor having a unique identification number representing the node location of the modular power quality monitoring device on the power quality control network,
  d) a regulated DC power supply, and
  e) a transmission circuit coupled to the microprocessor capable of interfacing with a communication medium of the power quality control network.

16. The modular power quality monitoring device of claim 15, wherein the plurality of electrical anomalies is chosen from the group including voltage levels, current draw, power surges, phase outages, phase shifting, power factor, harmonic distortion and panel load.

17. The modular power quality monitoring device of claim 15, wherein the power line circuit is an AC circuit chosen from the group consisting of a single, two and three phase AC circuit, the electrical connection to the AC power line circuit established by coupling the modular power quality monitoring device to the one, two or three phases, respectively, and ground of the AC circuit.

18. The modular power quality monitoring device of claim 17, further comprising a single LED for each phase of the AC power line circuit, each LED indicating whether the modular power quality monitoring device has detected a phase loss to the respective AC phase.

19. The modular power quality monitoring device of claim 15, wherein the microprocessor is a neuron chip comprising:
 a) memory,
 b) a transceiver port, and
 c) embedded firmware.

20. The modular power quality monitoring device of claim 19, wherein the neuron chip utilizes the LONWORKS® protocol over the power quality control network.

21. The modular power quality monitoring device of claim 15, wherein the communication medium is chosen from the group comprising modulated power line transmission, free topology—twisted pair, RS-485, fiber optic, RF carrier and computer modem communication.

22. The power quality monitoring device of claim 15, wherein the display means comprises an LCD display and a driver circuit coupled to the microprocessor.

23. The modular power quality monitoring device of claim 15, further comprising:
 a) user interface means for permitting a user to extract electrical anomaly data stored by the modular power quality monitoring device and for setting network parameters associated with the node location of the modular power quality monitoring device on the power quality control network, and
 b) alarm means for providing signals to a user that certain electrical anomalies have occurred on the power line.

24. The power quality monitoring circuit of claim 23, wherein the user interface means comprises a function and an enter push button, each push button electrically coupled to the microprocessor and capable of being actuated, permitting the user to access a series of menus for setting network parameters, displaying electrical anomaly data on the display means and initiating a data transmission along the power quality control network through the transmission circuit.

25. The modular power quality monitoring device of claim 23, wherein the user interface means comprises a computer interface connection to the device, the computer interface connection permitting the user to access a series of menus for setting network parameters, displaying electrical anomaly data on the display means and initiating a data transmission along the power quality control network through the transmission circuit.

26. The power quality monitoring circuit of claim 23, wherein the alarm means comprises a speaker and a driver circuit electrically coupled to the microprocessor.

27. A power quality monitoring system capable of detecting and storing data relating to a plurality of electrical anomalies occurring on a power line circuit, the system comprising at least two modular power quality monitoring devices, each modular device adaptable to a separate electrical anomaly detection circuit for forming a power quality control network, each modular device comprising:
 i) an electrical connection to the power line circuit,
 ii) voltage surge detection circuitry coupled to the electrical connection,
 iii) a microprocessor electrically coupled to the voltage surge detection circuitry, the microprocessor having a unique identification number representing the node location of the modular power quality monitoring device on the power quality control network,
 iv) a regulated DC power supply,
 v) transmission means for transmitting the electrical anomaly data detected and stored by the power quality monitoring system over the power quality control network to a central location, and
 vi) display means for displaying numeric and alphanumeric data relating to electrical anomalies detected by the power quality monitoring system.

28. The power quality monitoring system of claim 27, wherein the power line circuit is an AC circuit chosen from the group comprising of a single, two and three phase AC circuit, each modular device electrical connection to the AC power line circuit established by coupling each modular device to the one, two or three phases, respectively, and ground of the AC circuit.

29. The power quality monitoring system of claim 28, each modular power quality monitoring device further comprising a single LED for each phase of the AC power line circuit.

30. The power quality monitoring system of claim 27, wherein the microprocessor of each modular power quality monitoring device is a neuron chip comprising:
 a) memory,
 b) a transceiver port, and
 c) embedded firmware.

31. The power quality monitoring system of claim 30, wherein the transmission means is a transmitting circuit capable of interfacing with a communication medium of the power quality control network, the transmitting circuit coupled to the neuron chip transceiver port.

32. The power quality monitoring system of claim 31, wherein the communication medium is chosen from the group comprising modulated power line transmission, free topology—twisted pair, RS-485, fiber optic, RF carrier and computer modem communication.

33. The power quality monitoring system of claim 32, wherein the neuron chip utilizes LONWORKS® as the protocol over the power quality control network.

34. The power quality monitoring system of claim 27, wherein the display means of each modular power quality monitoring device comprises an LCD display and a driver circuit coupled to the microprocessor.

35. The power quality monitoring system of claim 27, each modular power quality monitoring device further comprising:
 a) user interface means for permitting a user to extract electrical anomaly data stored by each power quality monitoring device and for setting network parameters associated with the node location of each power quality monitoring device on the control network, and
 b) a speaker and a driver circuit electrically coupled to the microprocessor for providing an audible signal that an electrical anomaly has occurred.

36. The power quality monitoring system of claim 35, wherein the user interface means of each modular device comprises a function and an enter push button, each push button electrically coupled to the microprocessor and capable of being actuated, permitting the user to access a series of menus for setting network parameters, displaying electrical anomaly data on the display means and initiating a data transmission along the power quality control network through the transmission means.

37. The power quality monitoring circuit of claim 35, wherein the user interface means of each modular device comprises a computer interface connection to each device, the computer interface connection permitting the user to access a series of menus for setting network parameters, displaying electrical anomaly data on the display means and initiating a data transmission along the power quality control network through the transmission means.

38. The power quality monitoring system of claim 27, wherein the plurality of electrical anomalies is chosen from the group including voltage levels, current draw, power surges, phase outages, phase shifting, power factor, harmonic distortion and panel load.

* * * * *